United States Patent
Kim et al.

(10) Patent No.: US 11,705,416 B2
(45) Date of Patent: Jul. 18, 2023

(54) SEMICONDUCTOR PACKAGE INCLUDING STACKED SEMICONDUCTOR CHIPS AND METHOD FOR FABRICATING THE SAME

(71) Applicant: SK hynix Inc., Icheon-si Gyeonggi-do (KR)

(72) Inventors: Sungsu Kim, Icheon-si Gyeonggi-do (KR); Miyoung Kim, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 421 days.

(21) Appl. No.: 16/920,168

(22) Filed: Jul. 2, 2020

(65) Prior Publication Data

US 2021/0265297 A1 Aug. 26, 2021

(30) Foreign Application Priority Data

Feb. 24, 2020 (KR) ........................ 10-2020-0022310

(51) Int. Cl.
*H01L 23/00* (2006.01)
*H01L 25/065* (2023.01)

(52) U.S. Cl.
CPC .......... *H01L 24/13* (2013.01); *H01L 25/0657* (2013.01); *H01L 2924/1434* (2013.01)

(58) Field of Classification Search
CPC . H01L 2224/13076; H01L 2224/13078; H01L 2224/16105; H01L 2224/32145; H01L 24/13; H01L 25/0657
See application file for complete search history.

(56) References Cited

U.S. PATENT DOCUMENTS

| | | | | |
|---|---|---|---|---|
| 2006/0017175 A1* | 1/2006 | Akram | ................ | H05K 3/3436 257/E21.511 |
| 2012/0074532 A1* | 3/2012 | Shih | ....................... | H01L 24/14 257/629 |
| 2015/0221607 A1* | 8/2015 | Akamatsu | ............... | H01L 24/11 257/737 |
| 2016/0190089 A1* | 6/2016 | Yu | .......................... | H01L 24/94 438/107 |
| 2017/0200688 A1* | 7/2017 | Kim | ................. | H01L 23/49827 |

FOREIGN PATENT DOCUMENTS

KR 1020170083823 A 7/2017

* cited by examiner

*Primary Examiner* — Marcos D. Pizarro
(74) *Attorney, Agent, or Firm* — William Park & Associates Ltd.

(57) ABSTRACT

A semiconductor package may include: a first semiconductor chip; a second semiconductor chip disposed over the first semiconductor chip; and a bump structure interposed between the first semiconductor chip and the second semiconductor chip to connect the first semiconductor chip and the second semiconductor chip, wherein the bump structure includes a core portion and a shell portion, the shell portion surrounding all side ails of the core portion, and wherein the shell portion has a higher melting point than the core portion.

16 Claims, 11 Drawing Sheets

SEMICONDUCTOR PACKAGE INCLUDING STACKED SEMICONDUCTOR CHIPS AND METHOD FOR FABRICATING THE SAME

CROSS-REFERENCE TO RELATED APPLICATION

This application claims priority under 35 U.S.C. § 119 to Korean Patent Application No. 10-2020-0022310 filed on Feb. 24, 2020, which is incorporated herein by reference in its entirety.

BACKGROUND

1. Technical Field

This patent document relates to a semiconductor package, and more particularly, to a semiconductor package including a plurality of chips stacked over a substrate.

2. Related Art

Electronic products are required to process a large amount of data, while with a smaller volume. Thus, the need to increase the degree of integration of a semiconductor device that is used in such electronic products is increasing more and more.

However, due to the limitation of the semiconductor integration technology, the required function cannot be achieved by only a single semiconductor chip. Thus, a semiconductor package with a plurality of semiconductor chips embedded therein is fabricated.

SUMMARY

In an embodiment, a semiconductor package may include: a first semiconductor chip; a second semiconductor chip disposed over the first semiconductor chip; and a bump structure interposed between the first semiconductor chip and the second semiconductor chip to connect the first semiconductor chip and the second semiconductor chip, wherein the bump structure includes a core portion and a shell portion, the shell portion surrounding all sidewalls of the core portion, and the shell portion has a higher melting point than the core portion.

In an embodiment, a method for fabricating a semiconductor package may include: forming a first bump on an upper surface of a first semiconductor chip, the first bump including a first core portion, the first core portion with a first sidewall and other sidewalls, with the first sidewall of the first core portion facing a second core portion, and a first shell portion surrounding a part or all of the other sidewalls of the first core portion; forming a second bump on a lower surface of a second semiconductor chip, the second bump including the second core portion, the second core portion with a first sidewall and other sidewalls, with the first sidewall of the second core portion facing the first sidewall of the first core portion, and a second shell portion surrounding a part or all of the other sidewalls of the second core portion; and forming a core portion by joining the first sidewall of the first core portion and the first sidewall of the second core portion, wherein all sidewalk of the core portion are surrounded by the first shell portion and the second shell portion, and wherein the first and second shell portions have a higher melting point than the first and second core portions, respectively.

DETAILED DESCRIPTION

Figure 1:
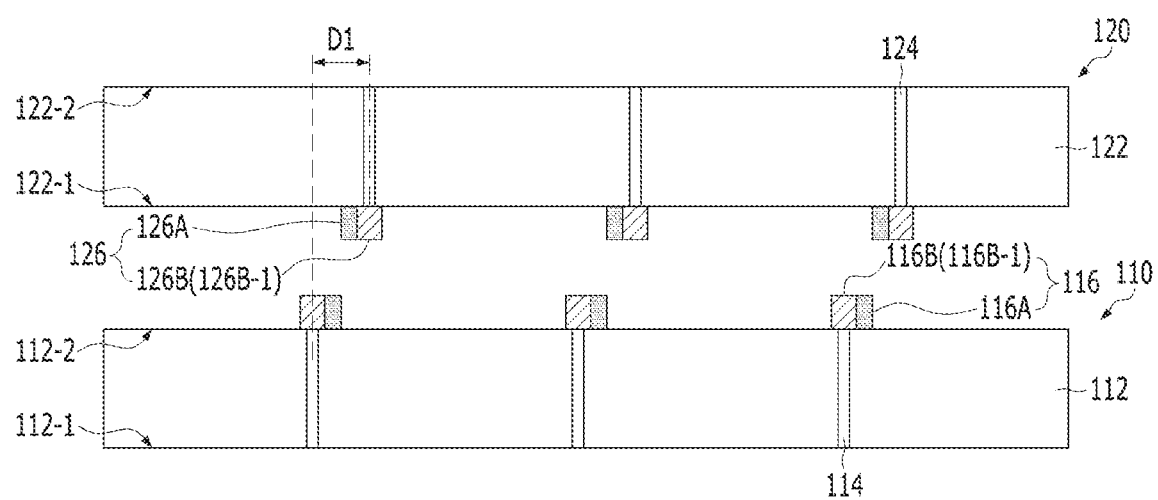
FIG. 1 is a cross-sectional view illustrating a first semiconductor chip and a second semiconductor chip of a semiconductor package according to an embodiment.

Various examples and implementations of the disclosed technology are described below in detail with reference to the accompanying drawings.

The drawings might not be necessarily to scale and in some instances, proportions of at least some of structures in the drawings may have been exaggerated in order to clearly illustrate certain features of the described examples or implementations. In presenting a specific example in a drawing or description with two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Various embodiments are directed to a semiconductor package including stacked semiconductor chips, which can improve performance and reduce process constraints and process defects, and a method for fabricating the same.

Figure 2:
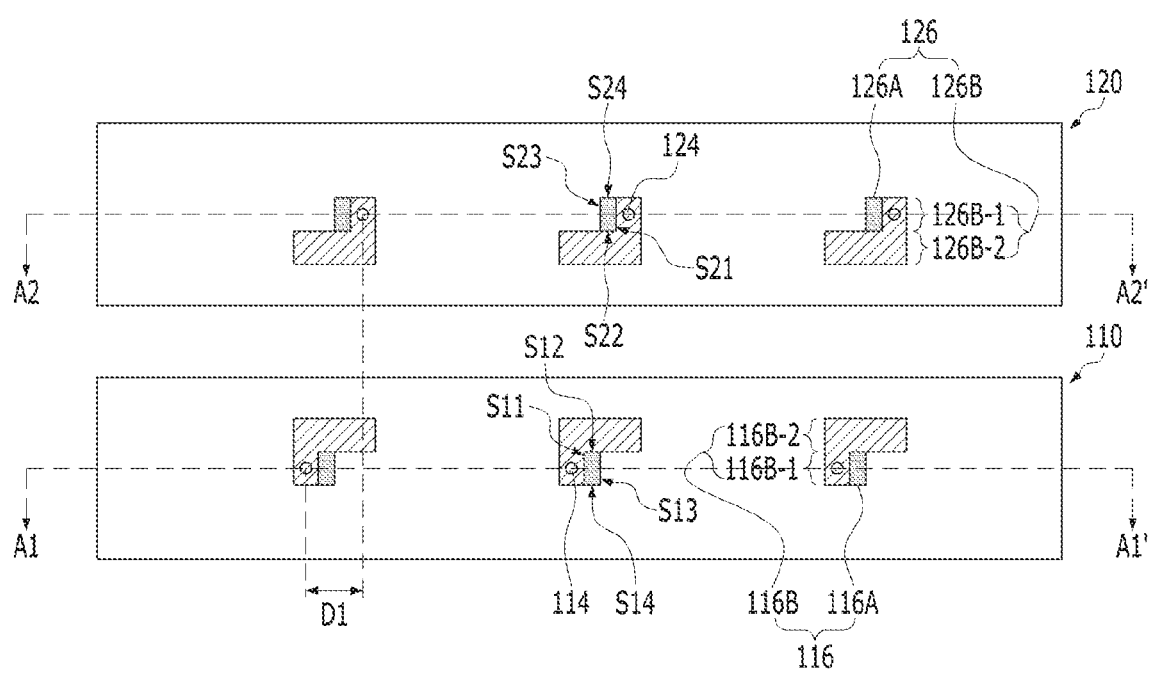
FIG. 2 is a planar view, illustrating an upper surface of the first semiconductor chip of FIG. 1 and a lower surface of the second semiconductor chip of FIG. 1.
Figure 3:
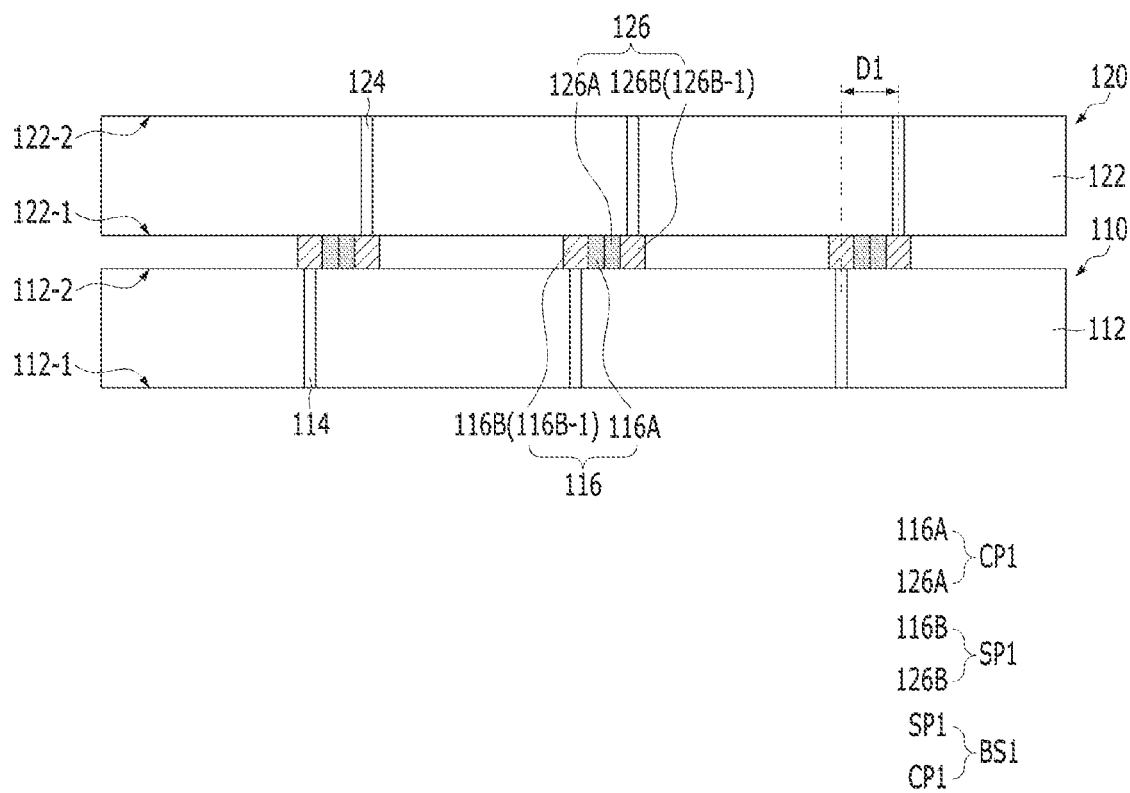
FIG. 3 is a cross-sectional view illustrating a state in which the first semiconductor chip and the second semiconductor chip of FIG. 1 are stacked.
Figure 4:
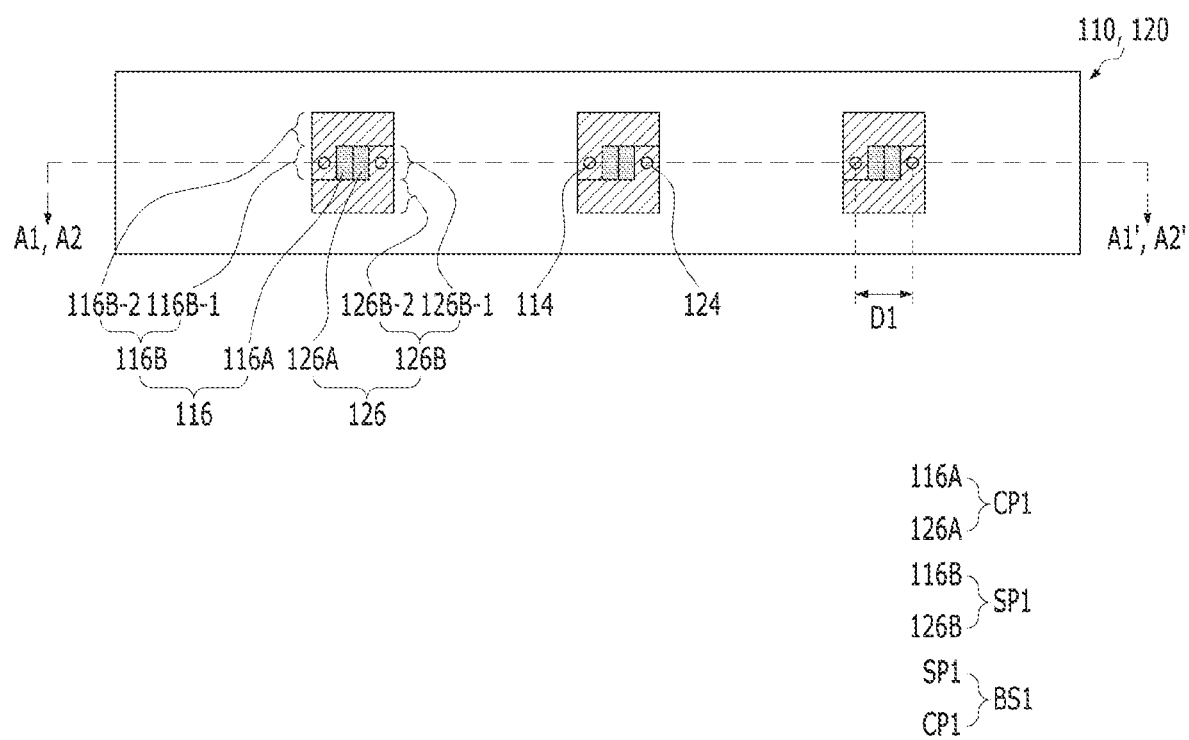
FIG. 4 is a planar view, illustrating an upper surface of the first semiconductor chip and/or a lower surface of the second semiconductor chip in the state of FIG. 3.

FIGS. 1 to 4 are diagrams that describe a semiconductor package and a method for fabricating the same in accordance with an embodiment of the present disclosure. FIG. 1 is a cross-sectional view illustrating a first semiconductor chip and a second semiconductor chip of a semiconductor package according to an embodiment. FIG. 1 illustrates an alignment state of the first semiconductor chip and the second semiconductor chip before the second semiconductor chip is stacked over the first semiconductor chip. FIG. 2 is a planar view illustrating an upper surface of the first semiconductor chip of FIG. 1 and a lower surface of the second semiconductor chip of FIG. 1. FIG. 3 is a cross-sectional view illustrating a state in which the first semiconductor chip and the second semiconductor chip of FIG. 1 are stacked. FIG. 4 is a planar view illustrating an upper surface of the first semiconductor chip and/or a lower surface of the second semiconductor chip in the state of FIG. 3. For convenience of description, the penetrating electrodes that are not visible from the upper surface of the first semiconductor chip and the lower surface of the second semiconductor chip are also shown in FIG. 2 and FIG. 4. The first semiconductor chip of FIG. 1 corresponds to a cross-section along a line A1-A1' of FIG. 2, and the second semiconductor chip of FIG. 1 corresponds to a cross-section of a line A2-A2' of FIG. 2. The stacked first and second semiconductor chips of FIG. 3 correspond to a cross-section along a line A1-A1' and/or a line A2-A2' of FIG. 4.

First, a fabrication method will be described.

Referring to FIGS. 1 and 2, a first semiconductor chip 110 and a second semiconductor chip 120, to be stacked up and down, may be provided.

The first semiconductor chip 110 may include a first body portion 112, a first penetrating electrode 114, and a first bump 116.

The first body portion 112 may include a semiconductor material, such as silicon (Si) or germanium (Ge). Although not illustrated, various wirings and/or circuit structures may be formed in the first body portion 112, The first body portion 112 may have a plate shape that is defined by a lower surface 112-1, an upper surface 112-2, and side surfaces connecting them to each other. As an example, the first body portion 112 may have a square plate shape.

The first penetrating electrode 114 may have a pillar shape that extends from the upper surface 112-2 of the first body portion 112 to the lower surface 112-1, the first penetrating electrode 114 penetrating the first body portion 112. As an example, the first penetrating electrode 114 may be a through silicon via (TSV). The first penetrating electrode 114 may include various conductive materials, such as copper (Cu), tungsten (W), nickel (Ni), ruthenium (Ru), cobalt (Co), or a combination thereof. A plurality of first penetrating electrodes 114 may penetrate the first body portion 112, and at least one of the plurality of first penetrating electrodes 114 may be electrically connected to the wirings and/or circuit structures of the first body portion 112. In this embodiment, the plurality of first penetrating electrodes 114 are shown to be arranged at regular intervals in a line in one direction (for example, in a horizontal direction in a planar view). However, the arrangement of the first penetrating electrodes 114 may be varied.

A plurality of first bumps 116 may be formed over the upper surface 112-2 of the first body portion 112 to be electrically connected to the upper ends of the plurality of first penetrating electrodes 114, respectively. Each of the first bumps 116 may include a first core portion 116A and a first shell portion 116B, The first core portion 116A and the first shell portion 116B may be disposed side by side over the upper surface 112-2 of the first body portion 112, the sidewalls of the first core portion 116A and the first shell portion 116B being in contact with each other. Here, the first shell portion 116B of the first bump 116 may overlap with the first penetrating electrode 114 and may be electrically connected to the first penetrating electrode 114. On the other hand, the first core portion 116A might not overlap with the first penetrating electrode 114 and may be disposed at one side of the first penetrating electrode 114 and/or disposed at one side of the first shell portion 116B. Accordingly, the first core portion 116A may be electrically connected to the first penetrating electrode 114 through the first shell portion 116B. The arrangement and shape of the first core portion 116A and the first shell portion 116B will be described below.

The first shell portion 116B may overlap with the first penetrating electrode 114, and thus, a lower surface of the first shell portion 116B may be in direct contact with the upper end of the first penetrating electrode 114 or a pad (not shown) which is connected to the upper end of the first penetrating electrode 114. Furthermore, the first shell portion 116B may function not only to overlap/connect with the first penetrating electrode 114, but also to surround a part of the sidewalls of the first core portion 116A and/or a second core portion 126A, which will be described later. For this reason, the first shell portion 116B may include an overlapping portion, which overlaps with the first penetrating electrode 114 and contacts a part of the sidewall of the first core portion 116A, and may include an extending portion that extends from this overlapping portion and covers another part of the sidewall of the first core portion 116A and/or a part of a sidewall of the second core portion 126A. Hereinafter, the overlapping portion of the first shell portion 116B will be referred to as a first overlapping portion 116B-1, and the extending portion of the first shell portion 116B will be referred to as a first extending portion 116B-2, Since the first overlapping portion 116B-1 of the first shell portion 116B overlaps with the first penetrating electrode 114, a vertical axis passing through the first overlapping portion 116B-1 and a vertical axis passing through the first penetrating electrode 114 may be aligned with each other on a straight line. However, the planar area of the first overlapping portion 116B-1 may be larger than the planar area of the first penetrating electrode 114. The first extending portion 116B-2 of the first shell portion 116B may extend from the first overlapping portion 116B-1 toward the first core portion 116A (for example, toward a right side) so as to surround another part of the sidewall of the first core portion 116A.

The first core portion 116A may be disposed at one side of the first overlapping portion 116B-1. More specifically, the first core portion 116A may be disposed in consideration of the position of the second core portion 126A of the second bump 126 of the second semiconductor chip 120 to be described later. That is, the first core portion 116A may be disposed at a side that faces the second core portion 126A based on the first overlapping portion 116B-1. In this embodiment, since the second core portion 126A is disposed at a right side compared to the first core portion 116A, the first core portion 116A may be disposed at a right side of the first overlapping portion 116B-1. The first penetrating electrode 114 might not overlap with and/or contact the first core portion 116A.

The first core portion 116A may have a pillar shape. In this embodiment, the first core portion 116A may have a pillar shape with a planar rectangular shape. Accordingly, the first core portion 116A may include a first sidewall S11 that is closest to the first penetrating electrode 114, a third sidewall S13 that is positioned opposite to the first sidewall S11, a second sidewall S12 that connects the first sidewall S11 and the third sidewall S13, and a fourth sidewall S14 that is positioned on the opposite side of the second sidewall S12. In the present embodiment, in a planar view, the first sidewall S11, the second sidewall S12, the third sidewall S13, and the fourth sidewall S14 may correspond to a left sidewall, an upper sidewall, a right sidewall, and a lower sidewall, respectively. In this case, the first overlapping portion 116B-1 may contact the first sidewall S11 of the first core portion 116A, and the first extending portion 116B-2 may be bent toward the first core portion 116A (for example, toward a right side) to contact the second sidewall S12 of the first core portion 116A. The first shell portion 116B may contact the first sidewall S11 and the second sidewall S12 of the first core portion 116A, and thus, the first shell portion 116B may have a bent shape that is similar to a ¬ shape surrounding half of the sidewalls (2/4) of the first core portion 116A. However, the present disclosure is not limited thereto, and, in a planar view, the shape of the first core portion 116A and the relative position and/or shape of the first shell portion 116B may be varied. For example, the first extending portion 116B-2 may be disposed to contact the fourth sidewall S14 of the first core portion 116A, instead of the second sidewall S12 of the first core portion 116A. In this case, the first shell portion 116B may have a bent shape similar to a ⌊ shape.

Meanwhile, the first extending portion 116B-2 may contact the second sidewall S12 of the first core portion 116A and may protrude farther than the second sidewall S12 of the first core portion 116A in its extending direction (for example, toward a right side). This is to further surround a part of a sidewall of the second core portion 126A, which will be described later in a relevant section.

The first core portion 116A and the first shell portion 116B may include a conductive material, such as a metal material. However, the first core portion 116A may be formed of a material with a lower melting point than the first shell portion 116B. For example, the first core portion 116A may include tin (Sn), copper (Cu), silver (Ag), lead (Pb), or a combination thereof, and the first shell portion 116B may include nickel (Ni), copper (Cu), tungsten (W), titanium (Ti), or a combination thereof. The material that forms the first core portion 116A may melt at a specific reflow temperature to form a joint between materials, while the material that forms the first shell portion 116B might not melt at this reflow temperature.

The first semiconductor chip 110 described above may include a volatile memory such as a dynamic random access memory (DRAM), a static RAM (SRAM) or the like, a nonvolatile memory such as a NAND flash, a resistive RAM (RRAM), a phase-change RAM (PRAM), a magnetoresistive RAM (MRAM) or the like, and various other active devices or passive devices.

The second semiconductor chip 120 may include a second body portion 122, a second penetrating electrode 124, and a second bump 126.

The second body portion 122 may include a semiconductor material such as silicon (Si) or germanium (Ge). Although not illustrated, various wirings and/or circuit structures may be formed in the second body portion 122. The second body portion 122 may have a plate shape that is defined by a lower surface 122-1, an upper surface 122-2, and side surfaces that connect them to each other. For example, the second body portion 122 may have a rectangle plate shape.

The second penetrating electrode 124 may have a pillar shape that extends from the upper surface 122-2 of the second body portion 122 to the lower surface 122-1 to penetrate the second body portion 122. For example, the second penetrating electrode 124 may be a TSV. The second penetrating electrode 124 may include various conductive materials, such as copper (Cu), tungsten (W), nickel (Ni), ruthenium (Ru), cobalt (Co), or a combination thereof. A plurality of second penetrating electrodes 124 may penetrate the second body portion 122, and at least one of the plurality of second penetrating electrodes 124 may be electrically connected to the wirings and/or circuit structures of the second body portion 122. In this embodiment, the plurality of second penetrating electrodes 124 are shown to be arranged at regular intervals in a line in one direction (for example, in a horizontal direction in a planar view). However, the arrangement of the second penetrating electrodes 124 may be varied. However, in a planar view, the arrangement/positions of the second penetrating electrodes 124 may be determined in consideration of the arrangement/positions of the first penetrating electrodes 114 and the sizes of the first and second bumps 116 and 126. When one of the second penetrating electrodes 124 needs to be connected to a corresponding one of the first penetrating electrodes 114, this second penetrating electrode 124 may be adjacent to the corresponding first penetrating electrode 114, without overlapping with the corresponding first penetrating electrode 114. That is, the first penetrating electrode 114 and the second penetrating electrode 124 may be spaced apart from each other in a planar view so that a vertical axis that passes through the second penetrating electrode 124 might not be aligned with a vertical axis that passes through the corresponding first penetrating electrode 114. As in the present embodiment, when the first penetrating electrodes 114 are repeatedly arranged at regular intervals along the horizontal direction, the second penetrating electrodes 124 may be also repeatedly arranged at the same interval along the horizontal direction. However, the second penetrating electrodes 124 may be arranged to be shifted by a certain distance (see D1) toward a right side compared to the first penetrating electrodes 114.

A plurality of second bumps 126 may be formed over the lower surface 122-1 of the second body portion 122 to be electrically connected to lower ends of the plurality of second penetrating electrodes 124, respectively. Each of the second bumps 126 may include a second core portion 126A and a second shell portion 126B. The second core portion 126A and the second shell portion 126B may be disposed side by side over the lower surface 122-1 of the second body portion 122, the sidewalls of the second core portion 126A and the second shell portion 126B being in contact with each other. Here, the second shell portion 126B of the second bump 126 may overlap with the second penetrating electrode 124 and may be electrically connected to the second penetrating electrode 124. On the other hand, the second core portion 126A might not overlap with the second penetrating electrode 124 and may be disposed at one side of the second penetrating electrode 124 and/or disposed at one side of the second shell portion 126B. Accordingly, the second core portion 126A may be electrically connected to the second penetrating electrode 124 through the second shell portion 126B. The arrangement and shape of the second core portion 126A and the second shell portion 126B will be described below.

The second shell portion 126B may overlap with the second penetrating electrode 124, and thus, an upper surface of the second shell portion 126B may be in direct contact with the lower end of the second penetrating electrode 124 or a pad (not shown) which is connected to the lower end of the second penetrating electrode 124. Furthermore, the second shell portion 126B may function not only to overlap/connect with the second penetrating electrode 124, but also to surround a part of the sidewalls of the second core portion 126A and/or the first core portion 116A. For this reason, the second shell portion 126B may include a second overlapping portion 126B-1 which overlaps with the second penetrating electrode 124 and contacts a part of the sidewall of the second core portion 126A, and may include a second extending portion 126B-2 that extends from the second overlapping portion 126B-1 and covers another part of the sidewall of the second core portion 126A and/or a part of the sidewall of the first core portion 116A. Since the second overlapping portion 126B-1 overlaps with the second penetrating electrode 124, a vertical axis passing through the second overlapping portion 126B-1 and a vertical axis passing through the second penetrating electrode 124 may be aligned with each other on a straight line. The second extending portion 126B-2 may extend from the second overlapping portion 126B-1 toward the second core portion 126A (for example, toward a left side) so as to surround another part of the sidewall of the second core portion 126A.

The second core portion 126A may be disposed at one side of the second overlapping portion 126B-1. More specifically, the second core portion 126A may be disposed in consideration of the position of the first core portion 116A. That is, the second core portion 126A may be disposed at a side that faces the first core portion 116A based on the second overlapping portion 126B-1. In this embodiment, since the first core portion 116A is disposed at a left side compared to the second core portion 126A, the second core portion 126A may be disposed at a left side of the second overlapping portion 126B-1. The second penetrating electrode 124 might not overlap with and/or contact the second core portion 126A.

The second core portion 126A may have a pillar shape. In this embodiment, the second core portion 126A may have a pillar shape with a planar rectangular shape. Accordingly, the second core portion 126A may include a first sidewall S21 that is closest to the second penetrating electrode 124, a third sidewall S23 that is positioned opposite to the first sidewall S21, a second sidewall S22 that connects the first sidewall S21 and the third sidewall S23, and a fourth sidewall S24 that is positioned on the opposite side of the second sidewall S22. In the present embodiment, in a planar view, the first sidewall S21, the second sidewall S22, the third sidewall S23, and the fourth sidewall S24 may correspond to a right sidewall, a lower sidewall, a left sidewall, and an upper sidewall, respectively. In this case, the second overlapping portion 126B-1 may contact the first sidewall S21 of the second core portion 126A, and the second extending portion 126B-2 may be bent toward the second core portion 126A (for example, toward a left side) to contact the second sidewall S22 of the second core portion 126A. The second shell portion 126B may contact the first sidewall S21 and the second sidewall S22 of the second core portion 126A, and thus, the second shell portion 126B may have a bent shape that is similar to a ⌋ shape surrounding half of the sidewalls (2/4) of the second core portion 126A. However, the present disclosure is not limited thereto, and, in a planar view, the shape of the second core portion 126A and the relative position and/or shape of the second shell portion 126B may be varied. In this case, the shape of the second core portion 126A and the relative position or shape of the second shell portion 126B may be determined in consideration of the position/shape of the first core portion 116A and the first shell portion 116B. For example, when the first extending portion 116B-2 contacts the fourth sidewall S14 of the first core portion 116A instead of the second sidewall S12 of the first core portion 116A, the second extending portion 126B-2 of the second shell portion 126B may be disposed to contact the fourth sidewall S24 of the second core portion 126A, and thus, the second extending portion 126B-2 of the second shell portion 126B may have a bent shape similar to a ¬ shape.

Meanwhile, the second extending portion 126B-2 may contact the second sidewall S22 of the second core portion 126A and may protrude farther than the second sidewall S22 of the second core portion 126A in its extending direction (for example, toward a left side). This is to further surround a part of the sidewall of the first core portion 116A, which will be described later in a relevant section.

The second core portion 126A and the second shell portion 126B may include a conductive material such as a metal material. However, the second core portion 126A may be formed of a material with a lower melting point than the second shell portion 126B. For example, the second core portion 126A may include tin (Sn), copper (Cu), silver (Ag), lead (Pb), or a combination thereof, and the second shell portion 126B may include nickel (Ni), copper (Cu), tungsten (W), titanium (Ti), or a combination thereof. The material that forms the second core portion 126A may melt at a specific reflow temperature to form a joint between materials, while the material that forms the second shell portion 126B might not melt at this reflow temperature. The material that forms the second core portion 126A may be the same as the material that forms the first core portion 116A. The material that forms the second shell portion 126B may be the same as the material that forms the first shell portion 116B. However, in other embodiments, the material that forms the second core portion 126A and the material that forms the first core portion 116A may be different from each other, and/or the material that forms the second shell portion 126B and the material that forms the first shell portion 116B may be different from each other.

The second semiconductor chip 120 described above may include a volatile memory such as a dynamic random access memory (DRAM), a static RAM (SRAM) or the like, a nonvolatile memory such as a NAND flash, a resistive RAM (RRAM), a phase-change RAM (PRAM), a magnetoresistive RAM (MRAM) or the like, and various other active devices or passive devices.

The second semiconductor chip 120 may be the same semiconductor chip as the first semiconductor chip 110 or a different semiconductor chip compared to the first semiconductor chip 110. Also, the sizes of the first semiconductor chip 110 and the second semiconductor chip 120 may be the same or may be different. However, regardless of the types and sizes of the first and second semiconductor chips 110 and 120, the shape/arrangement of the second bumps 126 of the second semiconductor chip 120 may be the same as a state in which the first bumps 116 of the first semiconductor chip 110 are rotated by 180 degrees.

Next, referring to FIGS. 3 and 4, the first semiconductor chip 110 and the second semiconductor chip 120, described in FIGS. 1 and 2, may be stacked while maintaining their alignment. Here, the first semiconductor chip 110 and the second semiconductor chip 120 may be stacked so that the A1-A1° line and the A2-A2' line may overlap with each other.

More specifically, the first core portion 116A of the first bump 116 of the first semiconductor chip 110 may contact the second core portion 126A of the second bump 126 of the second semiconductor chip 120. At this time, the third sidewall (see S13 of FIG. 2) of the first core portion 116A, facing the second core portion 126A, may contact the third sidewall (see S23 in FIG. 2) of the second core portion 126A, facing the first core portion 116A. For example, the right sidewall of the first core portion 116A may contact the left sidewall of the second core portion 126A.

In the above state, the first core portion 116A and the second core portion 126A may be joined by performing a reflow process at a certain temperature. That is, the first bump 116 and the second bump 126 may form a side contact structure and/or a side joint structure. In this figure, for convenience of description, a boundary is shown between the first core portion 116A and the second core portion 126A. However, the first core portion 116A and the second core portion 126A may be melted together to form a lump. This lump will be referred to as a core portion CP1. When the first core portion 116A and the second core portion 126A are formed of the same material, the core portion CP1 may include the same material. Alternatively, when the first core portion 116A and the second core portion 126A are formed of different materials, the core portion CP1 may include an alloy of these different materials.

On the other hand, during this reflow process, the first shell portion 116B and the second shell portion 126B may maintain their original shapes, without being transformed like the first core portion 116A and the second core portion 126A. For convenience of description, the first shell portion 116B and the second shell portion 126B will be collectively referred to as a shell portion SP1. Furthermore, the core portion CP1 and the shell portion SP1 will be collectively referred to as a bump structure BS1. Since the lower surface of the shell portion SP1 contacts the upper surface 112-2 of the first body portion 112 of the first semiconductor chip 110 and an upper surface of the shell portion SP1 contacts the lower surface 122-1 of the second body portion 122 of the second semiconductor chip 120, the shell portion SP1 may serve to maintain a gap between the first semiconductor chip 110 and the second semiconductor chip 120 in a vertical direction. This is the case because the first and second shell portions 116B and 126B maintain their original shapes even if the first and second core portions 116A and 126A are melted during the reflow process. The height of the shell portion SP1 in the vertical direction may be the same as the distance between the first semiconductor chip 110 and the second semiconductor chip 120.

After the side contact/joint of the first core portion 116A and the second core portion 126A is formed, all of the sidewalls of the core portion CP1 may be completely surrounded by the shell portion SP1. Since the first shell portion 116B and the second shell portion 126B are not deformed and maintain their original shape during the reflow process, the core portion CP1 may maintain a combined shape of the first core portion 116A and the second core portion 126A, despite the reflow process, based on the rectangular-hole pattern in the center of the shell portion SP1. For example, as in the present embodiment, the core portion CP1 may have a rectangle pillar shape. Here, the first sidewall of the first core portion 116A (see S11 of FIG. 2, for example, the left sidewall) and the second sidewall (see S12 of FIG. 2, for example, the upper sidewall) may be covered by the first shell portion 116B. Furthermore, the fourth sidewall (see S14 of FIG. 2, for example, the lower sidewall) may be covered by the second shell portion 126B, particularly by a protruding portion of the extending portion 126B-2 of the second shell portion 126β, which protrudes farther than the second core portion 126A toward a left side. Also, the first sidewall of the second core portion 126A (see S21 of FIG. 2, for example, the right sidewall) and the second sidewall (see S22 of FIG. 2, for example, the lower sidewall) may be covered by the second shell portion 126B. Furthermore, the fourth sidewall (see S24 of FIG. 2, for example, the upper sidewall) may be covered by the first shell portion 116B, particularly by a protruding portion of the extending portion 116B-2 of the first shell portion 116B, which protrudes farther than the first core portion 116A toward a right side. For reference, the third sidewall of the first core portion 116A (see S13 of FIG. 2, for example, the right sidewall) and the third sidewall of the second core portion 126A (see S23 of FIG. 2, for example, the left sidewall), which face each other, may contact and join each other.

Furthermore, the first extending portion 116B-2 of the first shell portion 116B may protrude farther than the core portion CP1 toward a right side to contact the second shell portion 126β, In addition, the second extending portion 126B-2 of the second shell portion 126B may protrude farther than the core portion CP1 toward a left side to contact the first shell portion 116B. In this case, the shell portion SP1 may securely surround the sidewall of the core portion CP1.

The first semiconductor chip 110 and the second semiconductor chip 120 may be connected by the bump structure BS1 in which the first bump 116 and the second bump 126 are combined at a side. Particularly, the first penetrating electrode 114 of the first semiconductor chip 110 may be electrically connected to the second penetrating electrode 124 of the second semiconductor chip 120 through the first shell portion 116B, the core portion CP1, and the second shell portion 126B.

Accordingly, a semiconductor package in which the first semiconductor chip 110 and the second semiconductor chip 120 are stacked may be implemented. The semiconductor package may have the following advantages.

First, since the bump structure BS1 that is disposed between the first semiconductor chip 110 and the second semiconductor chip 120 includes the core portion CP1 and the shell portion SP1 that completely surrounds the core portion CP1, it may be possible to maintain the structure of the shell portion SP1 with a relatively high melting point and may prevent the movement of the molten metal of the core portion CP1 even if the semiconductor package of the present embodiment enters multiple high temperature processes and the core portion CP1 with a relatively low melting point is melted again. Accordingly, a bridge failure between adjacent bump structures BS1 may be avoided.

In addition, even when pressure is applied to the bump structure BS1 when the first semiconductor chip 110 and the second semiconductor chip 120 are joined, the collapse of the bump structure BS1 may be avoided due to the presence of the shell portion SP1.

In addition, as the bridge failure between the bump structures BS1 is avoided and the collapse of the bump structure BS1 is prevented as described above, the gap between the bump structures BS1 may be reduced. Therefore, the gap between the first penetrating electrodes 114 and/or the gap between the second penetrating electrodes 124 may be reduced. That is, it is possible to implement the first semiconductor chip 110 and the second semiconductor chip 120 with a finer pitch.

As a result, the performance of the semiconductor package of this embodiment may be improved.

Furthermore, in the past, it was necessary to fill the gaps between the bumps in order to prevent the occurrence of bridge failure between the bumps. However, according to the semiconductor package of this embodiment, since the bridge between the bump structures BS1 is blocked primarily, there may be no problem even if the gap between the bump structures BS1 is narrowed and the filling property is lowered.

As a result, process constraints and/or process defects during the manufacturing of the semiconductor package may be reduced.

Furthermore, since the core portion CP1 and the shell portion SP1 of the bump structure 351 are disposed in the horizontal direction, the height of the space between the first semiconductor chip 110 and the second semiconductor chip 120 may be reduced. As a result, the height of the semiconductor package of this embodiment may be reduced.

According to the embodiment, the first shell portion 116B may surround half of the sidewall of the core portion CP1, and the second shell portion 126B may surround the other half of the sidewall of the core portion CP1. This is due to the fact that, in the above embodiment, the shape/arrangement of the second bump 126 is the same as the first bump 116, but rotated 180 degrees. However, the present disclosure is not limited thereto. As long as the shell portion SP1 surrounds all of the sidewalls of the core portion CP1 while the first semiconductor chip 110 and the second semiconductor chip 120 are connected by the bump structure BS1, the shapes of the first shell portion 116B and the second shell portion 126B may be varied. An example of this will be described with reference to FIGS. 5 and 6.

Figure 5:
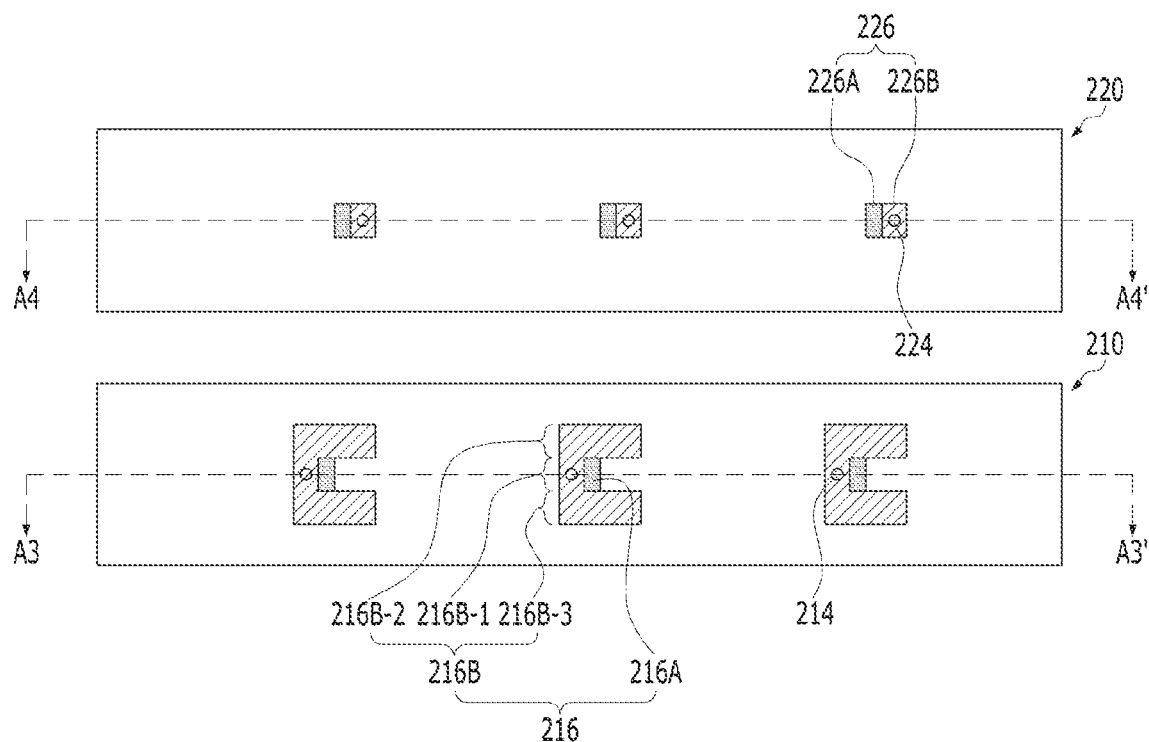
FIG. 5 is a planar view illustrating an upper surface of a first semiconductor chip and a lower surface of a second semiconductor chip of a semiconductor package according to another embodiment.
Figure 6:
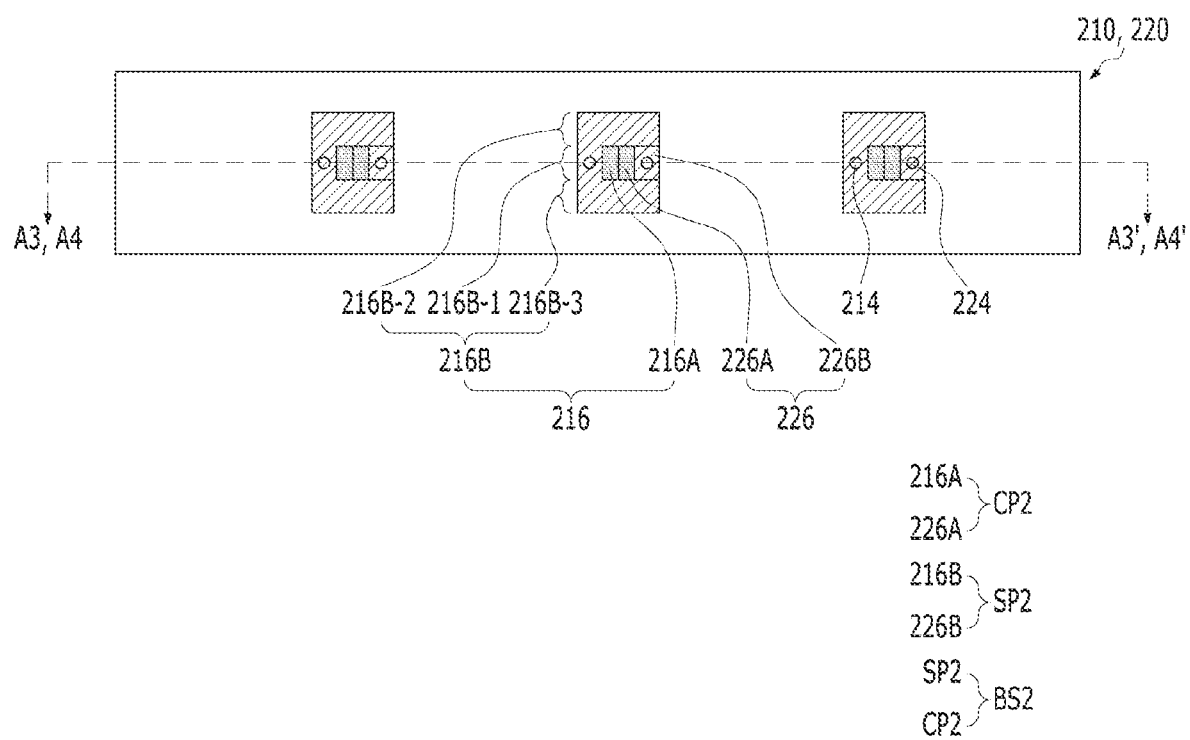
FIG. 6 is a planar view illustrating an upper surface of the first semiconductor chip and/or a lower surface of the second semiconductor chip in a state that the first and second semiconductor chips of FIG. 5 are stacked.

FIG. 5 is a planar view illustrating an upper surface of a first semiconductor chip and a lower surface of a second semiconductor chip of a semiconductor package according to another embodiment. FIG. 6 is a planar view illustrating an upper surface of the first semiconductor chip and/or a lower surface of the second semiconductor chip in a state that the first and second semiconductor chips of FIG. 5 are stacked. A cross section along a line A3-A3' of FIG. 5 may be substantially the same as the cross section of the first semiconductor chip of FIG. 1, a cross section along a line A4-A4' of FIG. 5 may be substantially the same as the cross section of the second semiconductor chip of FIG. 1, and a cross section along a line A3-A3' and/or A4-A4' of FIG. 6 may be substantially the same as the cross-section of the first and second semiconductor chips of FIG. 3. Therefore, in describing this embodiment, cross-sectional views have been omitted. The difference between the above-described embodiment and the current embodiment will be described below.

First, referring to FIG. 5, a first semiconductor chip 210 and a second semiconductor chip 220, to be stacked up and down, may be provided.

The first semiconductor chip 210 may include a first penetrating electrode 214 and a first bump 216. The first bump 216 may be connected to the first penetrating electrode 214. The second semiconductor chip 220 may include a second penetrating electrode 224 and a second bump 226. The second bump 226 may be connected to the second penetrating electrode 224.

Here, the first bump 216 may include a first core portion 216A and a first shell portion 216B. The first shell portion 216B may include a first overlapping portion 216B-1 that overlaps with the first penetrating electrode 214, and first and second extending portions 216B-2 and 216B-3 that extend from the first overlapping portion 216B-1 and bent toward the first core portion 216A. The first core portion 216A may have a rectangle pillar shape. The first core portion 216A may be disposed at a right side of the first overlapping portion 216B-1. Accordingly, a left sidewall of the first core portion 216A may contact the first overlapping portion 216B-1. The first extending portion 216B-2 may contact an upper sidewall of the first core portion 216A, and the second extending portion 216B-3 may contact a lower sidewall of the first core portion 216A. That is, the first shell portion 216B may cover three of the four sidewalls of the first core portion 216A, except for the right sidewall that will eventually contact the second core portion 226A.

Furthermore, each of the first and second extending portions 216B-2 and 216B-3 of the first shell portion 216B may protrude farther than the first core portion 216 toward a right side. This is to further surround a part of the sidewall of the second core portion 226A of the second bump 226, which will be described later. Furthermore, this is to contact the second shell portion 226B, which will also be described later.

The second bump 226 may include a second core portion 226A and a second shell portion 226B. The second shell portion 226B may overlap with the second penetrating electrode 224 and have a rectangle pillar shape. The second core portion 226A may have a rectangle pillar shape and may be disposed at a left side of the second shell portion 226B. Accordingly, a right sidewall of the second core portion 226A may contact the second shell portion 226B.

Next, referring to FIG. 6, the first semiconductor chip 210 and the second semiconductor chip 220 described in FIG. 5 may be stacked while maintaining their alignment.

More specifically, the first core portion 216A of the first bump 216 of the first semiconductor chip 210 may contact the second core portion 226A of the second bump 226 of the second semiconductor chip 220. At this time, the right sidewall of the first core portion 216A may contact the left sidewall of the second core portion 226A.

In the above state, when a reflow process is performed at a certain temperature, the first core portion 216A and the second core portion 226A may be melted together to form a core portion CP2.

A left sidewall, an upper sidewall, and a lower sidewall of the core portion CP2 may contact the first shell portion 216B, and a right sidewall of the core portion CP2 may contact the second shell portion 226B. Thus, all of the sidewalls of the core portion CP2 may be surrounded by the first shell portion 216B and the second shell portion 226B.

For convenience of description, the first shell portion 216B and the second shell portion 226B will be collectively referred to as a shell portion SP2. Furthermore, the core portion CP2 and the shell portion SP2 will be collectively referred to as a bump structure BS2.

Accordingly, the first semiconductor chip 210 and the second semiconductor chip 220 may be connected to each other by the bump structure BS2. The bump structure BS2 may include the core portion CP2 and the shell portion SP2. The shell portion SP2 may surround all of the sidewalls of the core portion CP2.

Meanwhile, in the above embodiments, the case where the first core portions 116A and 126A, the second core portions 216A and 226A, and the core portions CP1 and CP2 having a planar rectangle shape has been described. However, the present disclosure is not limited thereto. A first core portion and a second core portion may be pillar types with various planar shapes, such as half of a polygonal shape, a semicircular shape, a semielliptical shape, or the like, and a combined core portion may be a pillar type with a planar shape, such as a polygonal shape, a circular shape, an elliptical shape, or the like. An example of this will be described with reference to FIGS. 7 and 8.

Figure 7:
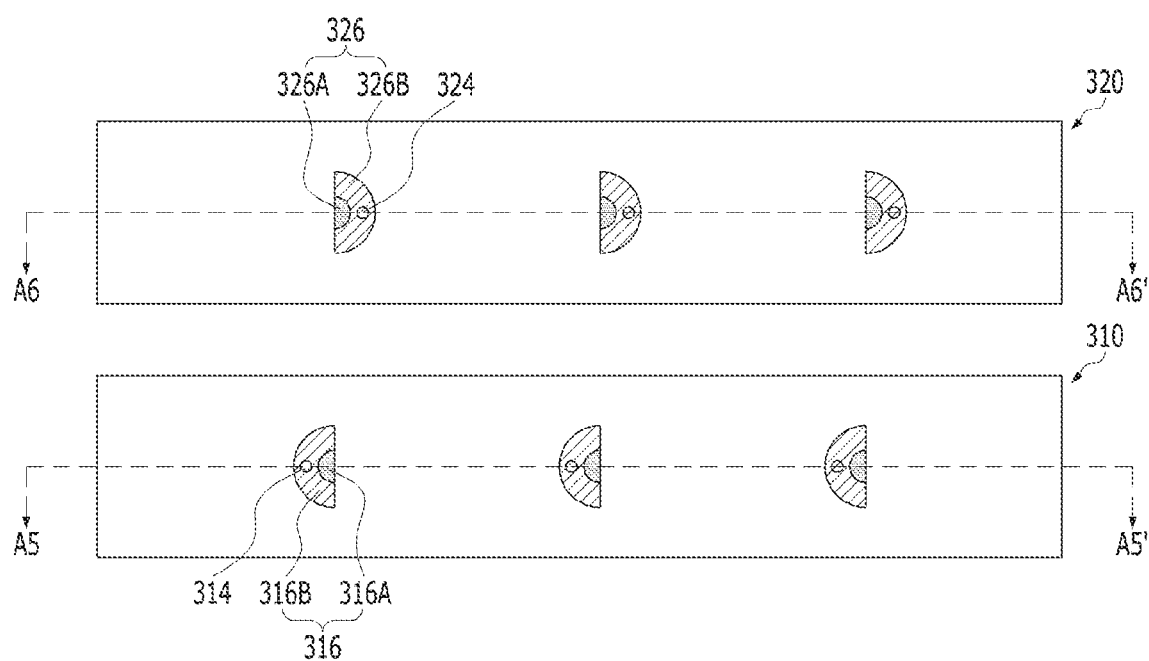
FIG. 7 is a planar view illustrating an upper surface of a first semiconductor chip and a lower surface of a second semiconductor chip of a semiconductor package according to another embodiment.
Figure 8:
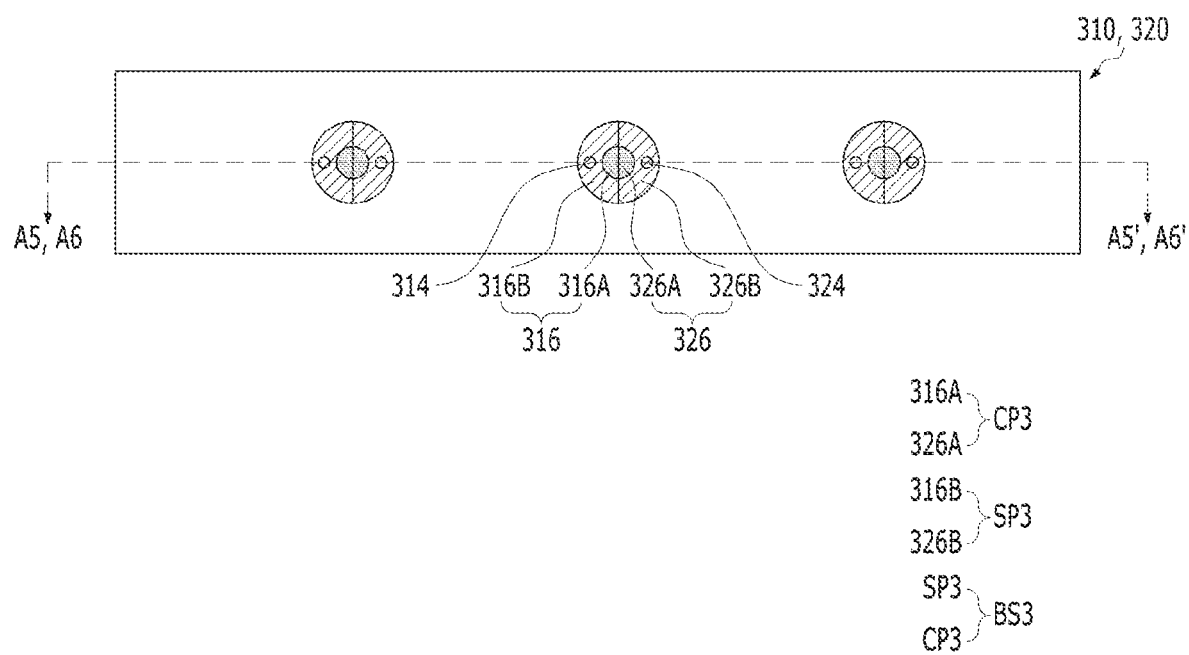
FIG. 8 is a planar view illustrating an upper surface of the first semiconductor chip and/or a lower surface of the second semiconductor chip in a state that the first and second semiconductor chips of FIG. 7 are stacked.

FIG. 7 is a planar view illustrating an upper surface of a first semiconductor chip and a lower surface of a second semiconductor chip of a semiconductor package according to another embodiment. FIG. 8 is a planar view illustrating an upper surface of the first semiconductor chip and/or a lower surface of the second semiconductor chip in a state that the first and second semiconductor chips of FIG. 7 are stacked. A cross section along a line A5-A5' of FIG. 7 may be substantially the same as the cross section of the first semiconductor chip of FIG. 1, a cross section along a line A6-A6' of FIG. 7 may be substantially the same as the cross section of the second semiconductor chip of FIG. 1, and a cross section along a line A5-A5' and/or A6-A6' of FIG. 8 may be substantially the same as the cross-section of the first and second semiconductor chips of FIG. 3. Therefore, in describing this embodiment, cross-sectional views have been omitted. The difference between the above-described embodiment and the current embodiment will be described below.

First, referring to FIG. 7, a first semiconductor chip 310 and a second semiconductor chip 320, to be stacked up and down, may be provided.

The first semiconductor chip 310 may include a first penetrating electrode 314 and a first bump 316, the first bump 316 being connected to the first penetrating electrode 314. The second semiconductor chip 320 may include a second penetrating electrode 324 and a second bump 326, the second bump 326 being connected to the second penetrating electrode 324.

Here, the first bump 316 may include a first core portion 316A and a first shell portion 316B. The planar shape of the first core portion 316A may be a semicircle. Accordingly, the first core portion 316A may have a straight sidewall that corresponds to a diameter of the semicircle and a curved sidewall that corresponds to a circumference of the semicircle. For example, the straight sidewall of the first core portion 316A may be disposed to face the second core portion 326A (for example, to a right side), and the curved sidewall may be disposed at a left side of the straight sidewall. The first shell portion 316B may be disposed at a left side of the first core portion 316A and may surround the curved sidewall of the first core portion 316A. The first shell portion 316B may overlap with the first penetrating electrode 314.

The second bump 326 may include a second core portion 326A and a second shell portion 326B. The planar shape of the second core portion 326A may be a semicircle. Accordingly, the second core portion 326A may have a straight sidewall that corresponds to a diameter of the semicircle and a curved sidewall that corresponds to a circumference of the semicircle. The straight sidewall of the second core portion 326A may be disposed to face the first core portion 316A (for example, to a left side), and the curved sidewall may be disposed at a right side of the straight sidewall. The second shell portion 326B may be disposed at a right side of the second core portion 326A and may surround the curved sidewall of the second core portion 326A. The second shell portion 326B may overlap with the second penetrating electrode 324.

Next, referring to FIG. 8, the first semiconductor chip 310 and the second semiconductor chip 320, described in FIG. 7, may be stacked while maintaining their alignment.

More specifically, the first core portion 316A of the first bump 316 of the first semiconductor chip 310 may contact the second core portion 326A of the second bump 326 of the second semiconductor chip 320. At this time, the straight sidewall of the first core portion 316A may contact the straight sidewall of the second core portion 326A.

In the above state, when a reflow process is performed at a certain temperature, the first core portion 316A and the second core portion 326A may be melted together to form a core portion CP3.

Left half of the curved sidewall of the core portion CP3 may contact the first shell portion 316B, and right half of the curved sidewall of the core portion CP3 may contact the second shell portion 326B. Thus, all of the sidewalls of the core portion CP3 may be surrounded by the first shell portion 3163 and the second shell portion 326B. The first shell portion 316B and the second shell portion 326B will be collectively referred to as a shell portion SP3. Furthermore, the core portion CP3 and the shell portion SP3 will be collectively referred to as a bump structure BS3.

Accordingly, the first semiconductor chip 310 and the second semiconductor chip 320 may be connected to each other by the bump structure B53. The bump structure B53 may include the core portion CP3 and the shell portion SP3. The shell portion SP3 may surround all of the sidewalls of the core portion CP3.

In the above-described embodiments, only two semiconductor chips are stacked. However, the present disclosure is not limited thereto, and three or more semiconductor chips may also be stacked. An example of this will be described with reference to FIG. 9.

Figure 9:
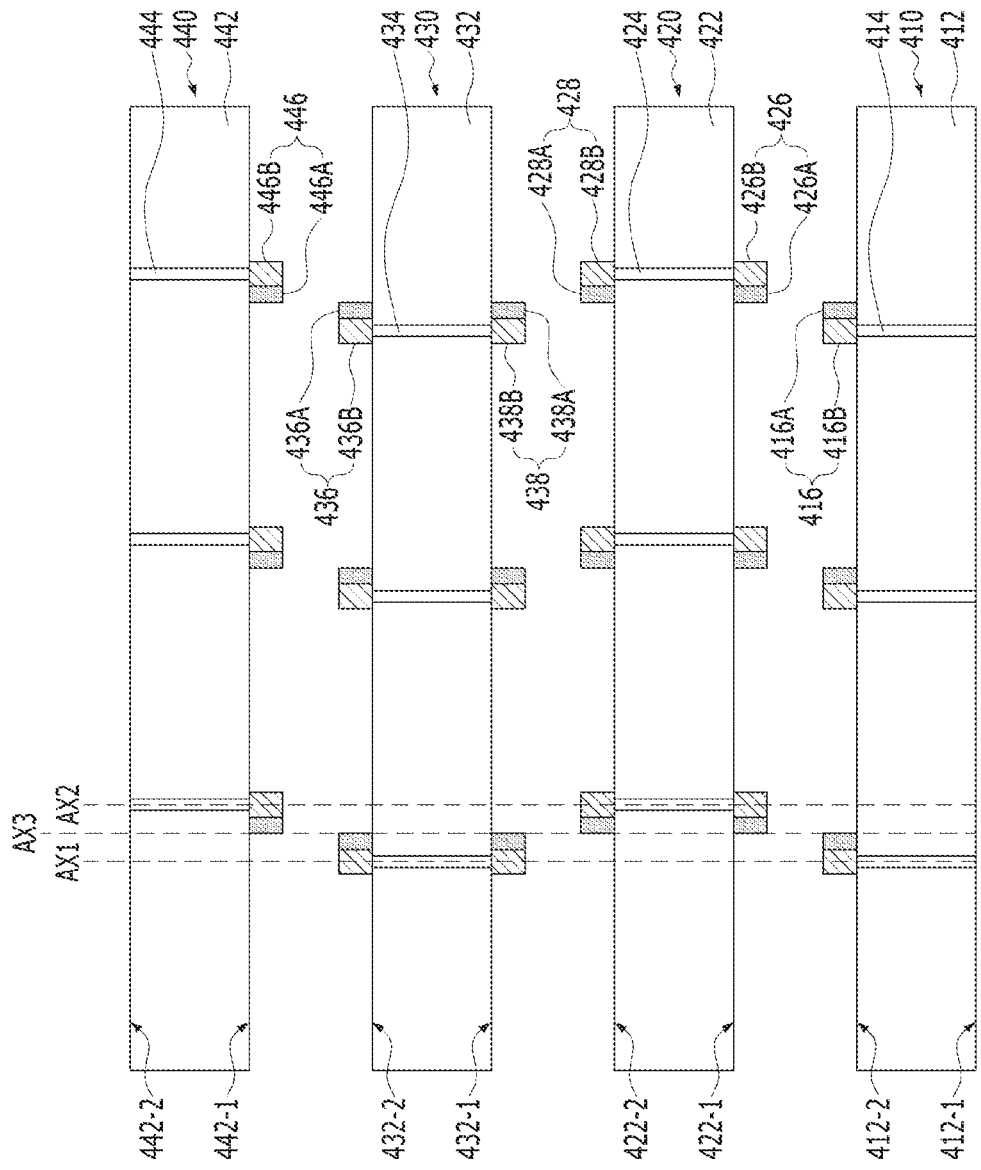
FIG. 9 is a cross-sectional view illustrating first to fourth semiconductor chips of a semiconductor package according to another embodiment.

FIG. 9 is a cross-sectional view illustrating first to fourth semiconductor chips of a semiconductor package according to another embodiment. FIG. 9 illustrates an alignment state of the first to fourth semiconductor chips before the first to fourth semiconductor chips are stacked.

Referring to FIG. 9, the first semiconductor chip 410 may include a first body portion 412 with a lower surface 412-1 and an upper surface 412-2, a first penetrating electrode 414 that penetrates the first body portion 412, and a first upper surface bump 416 that is disposed on the upper surface 412-2 of the first body portion 412 and connected to the first penetrating electrode 414. The first upper surface bump 416 may include a first upper surface core portion 416A and a first upper surface shell portion 416B. The first semiconductor chip 410 may be substantially the same as the first semiconductor chip 110 of FIG. 1 described above.

In this embodiment, assuming that the first semiconductor chip 410 is located at the bottom of the stack, a bump is not illustrated on the lower surface 412-1 of the first semiconductor chip 410. However, when the first semiconductor chip 410 is connected to a substrate (not shown) or another semiconductor chip (not shown) below it, a lower surface bump (not shown) may be disposed on the lower surface 412-1 of the first body portion 412 of the first semiconductor chip 410. The lower surface bump may be formed in the same shape at the same position as the first upper surface bump 416. In this case, the first semiconductor chip 410 may be the same as the third semiconductor chip 430, which will be described later. That is, the shape and arrangement of the first penetrating electrode 414, the first upper surface bump 416, and the lower surface bump (not shown) of the first semiconductor chip 410 may be the same as the shape and arrangement of the third penetrating electrode 434, the third upper surface bump 436 and the third lower surface bump 438 of the third semiconductor chip 430. However, the present disclosure is not limited thereto, and the shape and arrangement of the lower surface bump of the first semiconductor chip 410 may be different from the shape and arrangement of the first upper surface bump 416.

The second semiconductor chip 420 may include a second body portion 422 with a lower surface 422-1 and an upper surface 422-2, a second penetrating electrode 424 that penetrates the second body portion 422, a second lower surface bump 426 that is connected to the second penetrating electrode 424 on the lower surface 422-1 of the second body portion 422, and a second upper surface bump 428 that is connected to the second penetrating electrode 424 on the upper surface 422-2 of the second body portion 422. The second lower surface bump 426 may include a second lower surface core portion 426A and a second lower surface shell portion 4263. The second upper surface bump 428 may include a second upper surface core portion 428A and a second upper surface shell portion 428B. The second semiconductor chip 420 may be substantially the same as the second semiconductor chip 120 of FIG. 1 described above, except that the second upper surface bump 428 is further included.

The second upper surface bump 428 may be formed in the same shape at the same position as the second lower surface bump 426. That is, in a planar view, the second upper surface core portion 428A and the second upper surface shell portion 428B may overlap with the second lower surface core portion 426A and the second lower surface shell portion 4263. The second semiconductor chip 420 may further include the second upper surface bump 428 to connect with the third semiconductor chip 430, which will be stacked on the second semiconductor chip 420.

Similar to the above-described embodiment, the first semiconductor chip 410 and the second semiconductor chip 420 may be stacked based on the combination of the first upper surface bump 416 and the second lower surface bump 426. That is, the first upper surface core portion 416A of the first upper surface bump 416 and the second lower surface core portion 426A of the second lower surface bump 426 are joined at a side to form one core portion, and the first upper surface shell portion 416B and the second lower surface shell portions 426B may surround the sidewalls of the core portion so that a bump structure between the first semiconductor chip 410 and the second semiconductor chip 420 may be formed to connect the two semiconductor chips together.

The third semiconductor chip 430 may include a third body portion 432 with a lower surface 432-1 and an upper surface 432-2, a third penetrating electrode 434 that penetrates the third body portion 432, a third lower surface bump 438 that is connected to the third penetrating electrode 434 on the lower surface 432-1 of the third body portion 432, and a third upper surface bump 436 that is connected to the third penetrating electrode 434 on the upper surface 432-2 of the third body portion 432. The third lower surface bump 438 may include a third lower surface core portion 438A and a third lower surface shell portion 438B. The third upper surface bump 436 may include a third upper surface core portion 436A and a third upper surface shell portion 436B. The third semiconductor chip 430 may be substantially the same as the first semiconductor chip 410 or the first semiconductor chip 110 of FIG. 1 described above, except that the third lower surface bump 438 is further included.

The third lower surface bump 438 may be formed in the same shape at the same position as the third upper surface bump 436. That is, in a planar view, the third lower surface core portion 438A and the third lower surface shell portion 438B may overlap with the third upper surface core portion 436A and the third upper surface shell portion 436B. The third semiconductor chip 430 may further include the third lower surface bump 438 to connect with the second semiconductor chip 420.

The second semiconductor chip 420 and the third semiconductor chip 430 may be stacked based on the combination of the second upper surface bump 428 and the third lower surface bump 438 similarly to the above. That is, the second upper surface core portion 428A of the second upper surface bump 428 and the third lower surface core portion 438A of the third lower surface bump 438 may be joined at a side to form one core portion, and the second upper surface shell portion 428B and the third lower surface shell portion 438B may surround the sidewalls of the core portion, thereby forming a bump structure that is disposed between the second semiconductor chip 420 and the third semiconductor chip 430 to connect the two semiconductor chips together.

The fourth semiconductor chip 440 may include a fourth body portion 442 with a lower surface 442-1 and an upper surface 442-2, a fourth penetrating electrode 444 that penetrates the fourth body portion 442, and a fourth lower surface bump 446 that is connected to the fourth penetrating electrode 444 on the lower surface 442-1 of the fourth body portion 442. The fourth lower surface bump 446 may include a fourth lower surface core portion 446A and a fourth lower surface shell portion 446B. The fourth semiconductor chip 440 may be substantially the same as the second semiconductor chip 120 of FIG. 1 described above.

The third semiconductor chip 430 and the fourth semiconductor chip 440 may be stacked based on the combination of the third upper surface bump 436 and the fourth lower surface bump 446 in a similar manner to the other semiconductor chips above. That is, the third upper surface core portion 436A of the third upper surface bump 436 and the fourth lower surface core portion 446A of the fourth lower surface bump 446 may be joined at a side to form one core portion, and the third upper surface shell portion 436B and the fourth lower surface shell portion 446B may surround the sidewalls of the core portion, thereby forming a bump structure that is disposed between the third semiconductor chip 430 and the fourth semiconductor chip 440 to connect the two semiconductor chips together.

In this embodiment, assuming that the fourth semiconductor chip 440 is positioned at the top of the stack, a bump is not illustrated on the upper surface 442-2 of the fourth semiconductor chip 440. However, when the fourth semiconductor chip 440 is connected to another semiconductor chip (not shown) above it, an upper surface bump (not shown) may be disposed on the upper surface 442-2 of the fourth body portion 442 of the fourth semiconductor chip 440. The upper surface bump may be formed in the same shape at the same position as the fourth lower surface bump 446. In this case, the fourth semiconductor chip 440 may be the same as the second semiconductor chip 420. That is, the shape and arrangement of the fourth penetrating electrode 444, the fourth lower surface bump 446, and the upper surface bump (not shown) of the fourth semiconductor chip 440 may be the same as the shape and arrangement of the second penetrating electrode 424, the second lower surface bump 426 and the second upper surface bump 428 of the second semiconductor chip 420. However, the present disclosure is not limited thereto, and the shape and arrangement of the upper surface bumps of the fourth semiconductor chip 440 may be different from the shape and arrangement of the fourth lower surface bumps 446.

A plurality of semiconductor chips may be stacked in this manner, and thus, higher integration of the semiconductor package may be possible.

As illustrated in FIG. 9, in the semiconductor package in which a plurality of semiconductor chips are vertically stacked, the arrangement of penetrating electrodes of odd-numbered semiconductor chips may be identical to each other, and the arrangement of penetrating electrodes of even-numbered semiconductor chips may be identical to each other. Vertical axes that pass through the penetrating electrodes of the odd-numbered semiconductor chips may be aligned with each other (see AX1 of FIG. 9), and vertical axes that pass through the penetrating electrodes of the even-numbered semiconductor chips may also be aligned with each other (see AX2 of FIG. 9). However, the vertical axes that pass through the penetrating electrodes of the odd-numbered semiconductor chips and vertical axes that pass through the penetrating electrodes of the even-numbered semiconductor chips might not be located on a straight line, but may be arranged to be staggered with each other. In addition, the shapes and arrangements of the bumps of the odd-numbered semiconductor chips may be identical to each other, and the shapes and arrangement of the bumps of the even-numbered semiconductor chips may be identical to each other. However, the bottom bumps of the lowermost semiconductor chip may be omitted or may have a different shape or arrangement to connect with a substrate. Also, the top bumps of the uppermost semiconductor chip may be omitted or may have a different shape or arrangement to connect with other components. Meanwhile, the bump structures in which the upper and lower bumps are combined may overlap with each other. That is, vertical axes passing through centers of the plurality of bump structures that are arranged in the vertical direction may be aligned with each other (see AX3 of FIG. 9). These vertical axes (see AX3 of FIG. 9) may be located between the vertical axes that pass through the penetrating electrodes of the odd-numbered semiconductor chips (see AX1 of FIG. 9) and the vertical axes that pass through the penetrating electrodes of the even-numbered semiconductor chips (see AX2 of FIG. 9).

Figure 10:
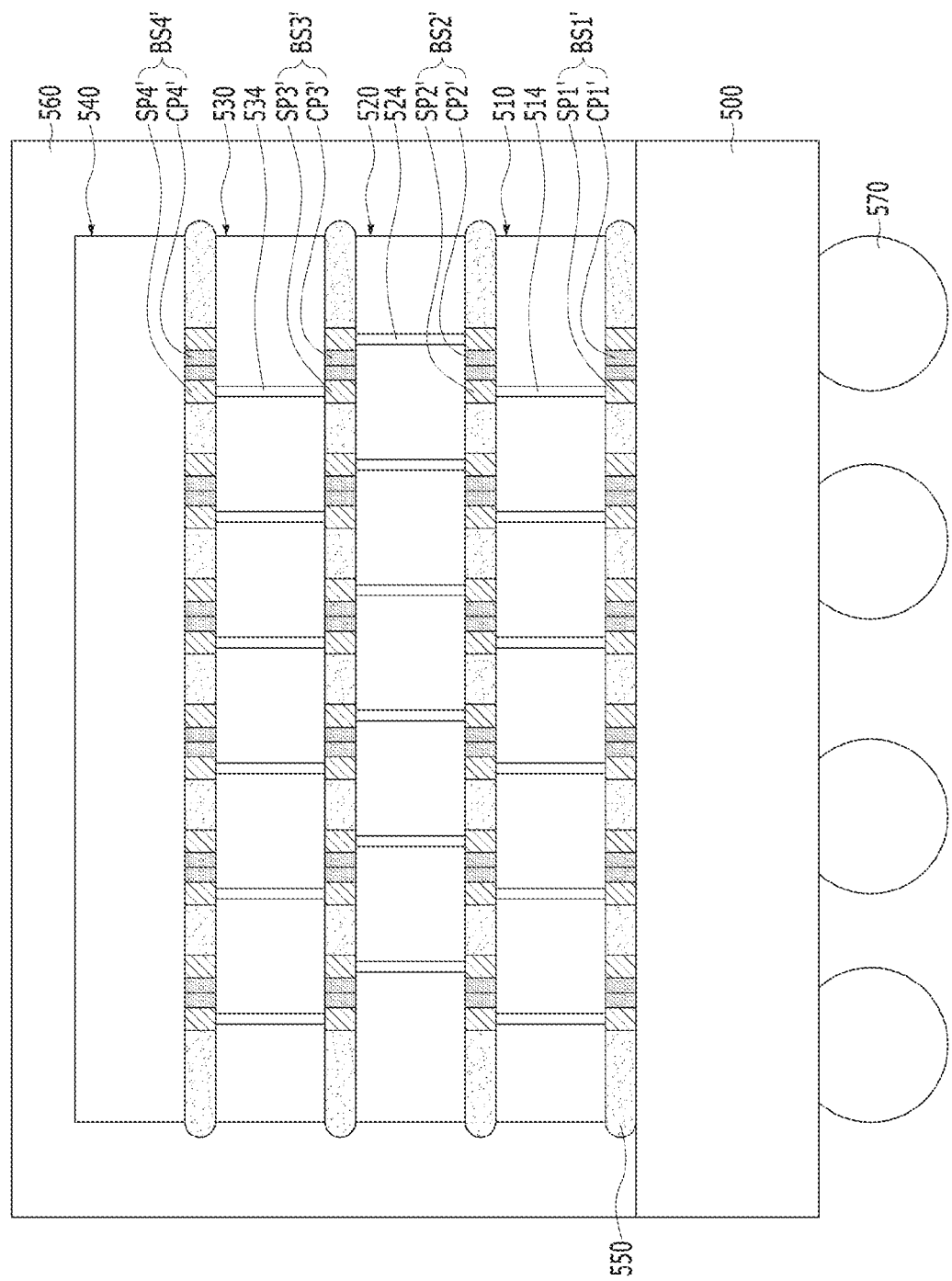
FIG. 10 is a cross-sectional view illustrating a semiconductor package according to another embodiment.

FIG. 10 is a cross-sectional view illustrating a semiconductor package according to another embodiment.

Referring to FIG. 10, a semiconductor package of the present embodiment may include a substrate 500 and first to fourth semiconductor chips 510, 520, 530, and 540 that are stacked on the substrate 500.

The substrate 500 may be a substrate for a semiconductor package with wirings and/or circuit structures for electric signal transmission such as a printed circuit board (PCB). The substrate 500 may include an upper surface on which the first to fourth semiconductor chips 510, 520, 530 and 540 are disposed, and may include a lower surface on which an external connection terminal 570 is disposed to connect the semiconductor package to an exterior device while being located on the opposite side of the upper surface.

The first semiconductor chip 510 may include a first penetrating electrode 514. A first bump structure BS1' that connects the first penetrating electrode 514 to the substrate 500 may be disposed between the first semiconductor chip 510 and the substrate 500. The first bump structure BS1' may include a first core portion CP1' and a first shell portion SP1' that surround the sidewalls of the first core portion CP1'. A lower end of the first penetrating electrode 514 may be connected to a part of the first shell portion SP1' at a side of the first core portion CP1' (for example, at a left side of the first core portion CP1'). Bonding pads (not shown) or the like on the upper surface of the substrate 500 may be directly or indirectly connected to the first shell portion SP1'.

The second semiconductor chip 520 may include a second penetrating electrode 524. A second bump structure BS2' that connects the first penetrating electrode 514 to the second penetrating electrode 524 may be disposed between the first semiconductor chip 510 and the second semiconductor chip 520. The second bump structure BS2' may include a second core portion CP2' and a second shell portion SP2' that surround the sidewalls of the second core portion CP2'. An upper end of the first penetrating electrode 514 may be connected to a part of the second shell portion SP2' at a side of the second core portion CP2' (for example, at a left side of the second core portion CP2'). A lower end of the second penetrating electrode 524 may be connected to another part of the second shell portion SP2' at another side of the second core portion CP2' (for example, at a right side of the second core portion CP2').

The third semiconductor chip 530 may include a third penetrating electrode 534. A third bump structure BST that connects the third penetrating electrode 534 to the second penetrating electrode 524 may be disposed between the third semiconductor chip 530 and the second semiconductor chip 520. The third bump structure BS3' may include a third core portion CP3' and a third shell portion SP3' that surround the sidewalls of the third core portion CP3'. An upper end of the second penetrating electrode 524 may be connected to a part of the third shell portion SP3' at a side of the third core portion CP3' (for example, at a right side of the third core portion CP3'). A lower end of the third penetrating electrode 534 may be connected to another part of the third shell portion SP3' at another side of the third core portion CP3' (for example, at a left side of the third core portion CP3').

The fourth semiconductor chip 540 may be located at a top, and thus might not include a penetrating electrode. However, in another embodiment, the fourth semiconductor chip 540 may include a penetrating electrode that is arranged in the same manner as the second penetrating electrode 524. A fourth bump structure BS4' that connects the third penetrating electrode 534 to a chip pad (not shown) of the fourth semiconductor chip 540 may be disposed between the third semiconductor chip 530 and the fourth semiconductor chip 540. The fourth bump structure BS4' may include a fourth core portion CP4' and a fourth shell portion SP4' that surround the sidewalls of the fourth core portion CP4'. An upper end of the third penetrating electrode 534 may be connected to a part of the fourth shell portion SP4' at a side of the fourth core portion CP4' (for example, at a left side of the fourth core portion CP4'). The chip pad (not shown) of the fourth semiconductor chip 540 may be directly or indirectly connected to the fourth shell portion SP4'.

Spaces between the first semiconductor chip 510 and the substrate 500, between the first semiconductor chip 510 and the second semiconductor chip 520, between the second semiconductor chip 520 and the third semiconductor chip 530, and between the third semiconductor chip 530 and the fourth semiconductor chip 540 may be filled with a filling material 550. However, since the semiconductor chips have fine pitches, spaces between the first bump structures BS1', between the second bump structures BS2', between the third bump structures BS3', and between the fourth bump structures BS4' may become narrower. Therefore, the filling material 550 might not completely fill these spaces, and micro voids may be generated in the filling material 550.

Here, since the first to fourth bump structures BS1', BS2', BS3' and BS4' have structures in which the sidewalls of the core portions CP1', CP2', CP3', and CP4' are surrounded by the shell portions SP1', SP2', SP3', and SP4' with high melting points, movement of metal materials forming the core portions CP1', CP2', CP3', and CP4' may be blocked even if the metal materials are melted in a high-temperature process section. Accordingly, even if gaps between the first bump structures BS1', between the second bump structures BS2', between the third bump structures BS3', and between the fourth bump structures BS4' are narrow, and even if the filling material 550 is not completely filled and micro voids are present in the filled material 550, bridge failure, due to the movement of the metal material, may be prevented.

The substrate 500 and the first to fourth semiconductor chips 510, 520, 530 and 540 may be surrounded by a molding layer 560. That is, the molding layer 560 may be formed to cover the first to fourth semiconductor chips 510, 520, 530, and 540 on the upper surface of the substrate 500. The molding layer 560 may include various molding materials such as EMC (Epoxy Mold Compound).

Figure 11:
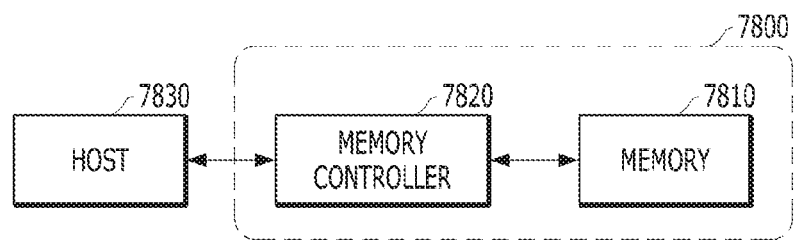
FIG. 11 shows a block diagram illustrating an electronic system employing a memory card including a semiconductor package according to an embodiment.

FIG. 11 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 12:
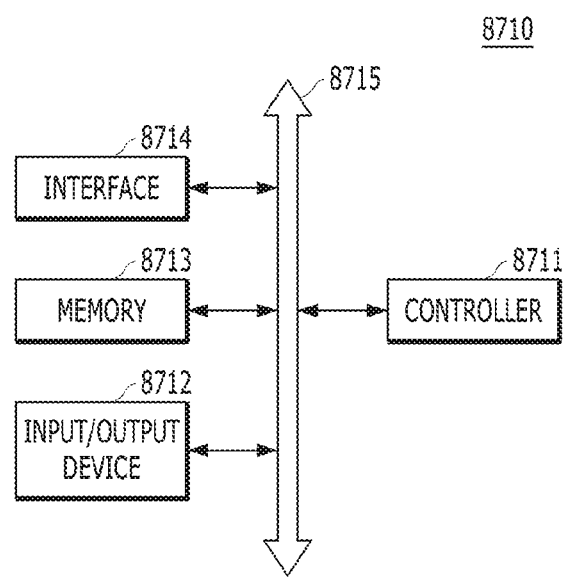
FIG. 12 shows a block diagram illustrating another electronic system including a semiconductor package according to an embodiment.

FIG. 12 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the present disclosure as defined in the following claims.

What is claimed is:

1. A semiconductor package comprising:
a first semiconductor chip;
a second semiconductor chip disposed over the first semiconductor chip; and
a bump structure interposed between the first semiconductor chip and the second semiconductor chip to connect the first semiconductor chip and the second semiconductor chip,
wherein the bump structure includes a core portion and a shell portion, the shell portion surrounding all sidewalls of the core portion, and
wherein the shell portion has a higher melting point than the core portion.

2. The semiconductor package of claim 1, wherein the core portion has a pillar shape.

3. The semiconductor package of claim 1, wherein an upper surface and a lower surface of the shell portion contact the second semiconductor chip and the first semiconductor chip, respectively.

4. The semiconductor package of claim 1, wherein a height of the shell portion is equal to a distance between the first semiconductor chip and the second semiconductor chip.

5. The semiconductor package of claim 1, wherein shell portion includes a first shell portion that is formed over an upper surface of the first semiconductor chip and connected to the first semiconductor chip, and a second shell portion formed over a lower surface of the second semiconductor chip and connected to the second semiconductor chip.

6. The semiconductor package of claim 5, wherein the second shell portion is the same as a state in which the first shell portion is rotated by 180 degrees with the core portion therebetween.

7. The semiconductor package of claim 5, wherein the first semiconductor chip includes a first penetrating electrode that overlaps with a part of the first shell portion, and wherein the second semiconductor chip includes a second penetrating electrode that overlaps with a part of the second shell portion.

8. The semiconductor package of claim 7, wherein a first vertical axis, in line with the first penetrating electrode, is different from a second vertical axis, in line with the second penetrating electrode, and wherein a vertical axis passing through the core portion is located between the first vertical axis and the second vertical axis.

9. The semiconductor package of claim 5, wherein the first shell portion partially surrounds sidewalls of the core portion, and wherein the second shell portion partially surrounds a rest of the sidewalls of the core portion so that a combination of the first and second shell portions completely surrounds all sidewalls of the core portion.

10. The semiconductor package of claim 9, wherein the first shell portion and the second shell portion each cover half of the sidewalls of the core portion.

11. The semiconductor package of claim 9, wherein one of the first and second shell portions includes a protruding portion protruding farther than the core portion, and the protruding portion is in contact with the other one of the first and second shell portions.

12. The semiconductor package of claim 1, further comprising:

one or more semiconductor chip disposed over the second semiconductor chip, wherein the bump structure is further interposed between the second semiconductor chip and one semiconductor chip of the one or more semiconductor chips, which is adjacent to the second semiconductor chip, or between two semiconductor chips of the one or more semiconductor chips, which are adjacent to each other.

13. The semiconductor package of claim 12, wherein each of the first semiconductor chip, the second semiconductor chip, and the one or more semiconductor chips includes a penetrating electrode, wherein the penetrating electrodes of the first semiconductor chip and an odd-numbered semiconductor chip of the one or more semiconductor chips are aligned with each other, wherein the penetrating electrodes of the second semiconductor chip and an even-numbered semiconductor chip of the one or more semiconductor chips are aligned with each other, and wherein a first vertical axis, in line with the penetrating electrodes of the first semiconductor chip and the odd-numbered semiconductor chip is different from a second vertical axis, in line with the penetrating electrodes of the second semiconductor chip and the even-numbered semiconductor chip.

14. The semiconductor package of claim 13, wherein the penetrating electrodes of the first semiconductor chip and the odd-numbered semiconductor chip overlap with a first portion of the shell portion, and wherein the penetrating electrodes of the second semiconductor chip and the even-numbered semiconductor chip overlap with a second portion of the shell portion.

15. The semiconductor package of claim 14, wherein the first portion of the shell portion and the second portion of the shell portion are located on opposite sides of each other with the core portion therebetween.

16. The semiconductor package of claim 14, wherein the first portion of the shell portion and the second portion of the shell portion are asymmetrical.

* * * * *